United States Patent
Wu et al.

(10) Patent No.: US 9,257,614 B2
(45) Date of Patent: Feb. 9, 2016

(54) WARM WHITE LED WITH STACKED WAFERS AND FABRICATION METHOD THEREOF

(71) Applicant: XIAMEN SANAN OPTOELECTRONICS TECHNOLOGY CO., LTD., Xiamen (CN)

(72) Inventors: Chaoyu Wu, Xiamen (CN); Chun-I Wu, Xiamen (CN); Shuying Qiu, Xiamen (CN); Yi-Yen Chen, Xiamen (CN); Ching-Shan Tao, Xiamen (CN); Wenbi Cai, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 14/639,051

(22) Filed: Mar. 4, 2015

(65) Prior Publication Data

US 2015/0179892 A1    Jun. 25, 2015

Related U.S. Application Data

(63) Continuation of application No. PCT/CN2013/082921, filed on Sep. 4, 2013.

(30) Foreign Application Priority Data

Sep. 10, 2012  (CN) .......................... 2012 1 0331791

(51) Int. Cl.
*H01L 33/46*   (2010.01)
*H01L 25/075*   (2006.01)
(Continued)

(52) U.S. Cl.
CPC ............ *H01L 33/46* (2013.01); *H01L 25/0756* (2013.01); *H01L 33/007* (2013.01); *H01L 33/0079* (2013.01); *H01L 33/0095* (2013.01); *H01L 33/22* (2013.01); *H01L 33/32* (2013.01); *H01L 33/405* (2013.01); *H01L 33/505* (2013.01); *H01L 33/387* (2013.01);
(Continued)

(58) Field of Classification Search
CPC ... H01L 33/46; H01L 33/0079; H01L 33/405; H01L 33/0095; H01L 33/22; H01L 33/32; H01L 33/007; H01L 33/505; H01L 25/0756
See application file for complete search history.

(56) References Cited

U.S. PATENT DOCUMENTS 6,563,139 B2 *  5/2003  Hen ..................... H01L 25/0753
                                                           257/79
7,064,354 B2 *  6/2006  Chen ................... H01L 25/0756
                                                           257/77
(Continued)

FOREIGN PATENT DOCUMENTS

| CN | 1851947 A | 10/2006 |
|---|---|---|
| CN | 102214756 A | 10/2011 |
| CN | 202195296 A | 4/2012 |

*Primary Examiner* — John P Dulka
(74) *Attorney, Agent, or Firm* — Syncoda LLC; Feng Ma

(57) ABSTRACT

A warm-white-light LED structure combines a red light wafer and a blue light wafer via a bonding layer. A reflecting layer is arranged over upper and lower surfaces of the bonding layer respectively; the lower surface of the red light wafer takes up one-third or less of the upper surface of the blue light wafer, which effectively reduces packaging structure volume and time of bondings so as to optimize process flow and save fabrication cost.

12 Claims, 9 Drawing Sheets

(51) Int. Cl.
*H01L 33/00* (2010.01)
*H01L 33/22* (2010.01)
*H01L 33/32* (2010.01)
*H01L 33/50* (2010.01)
*H01L 33/40* (2010.01)
*H01L 33/38* (2010.01)

(52) U.S. Cl.
CPC ..... *H01L2224/06* (2013.01); *H01L 2924/0002* (2013.01); *H01L 2933/0025* (2013.01); *H01L 2933/0041* (2013.01)

(56) References Cited

U.S. PATENT DOCUMENTS

| | | | |
|---|---|---|---|
| 2008/0251799 A1* | 10/2008 | Ikezawa | H01L 25/0756 257/89 |
| 2011/0241037 A1* | 10/2011 | Park | H01L 25/0756 257/89 |
| 2013/0277692 A1* | 10/2013 | Chang | H01L 25/0756 257/89 |

* cited by examiner

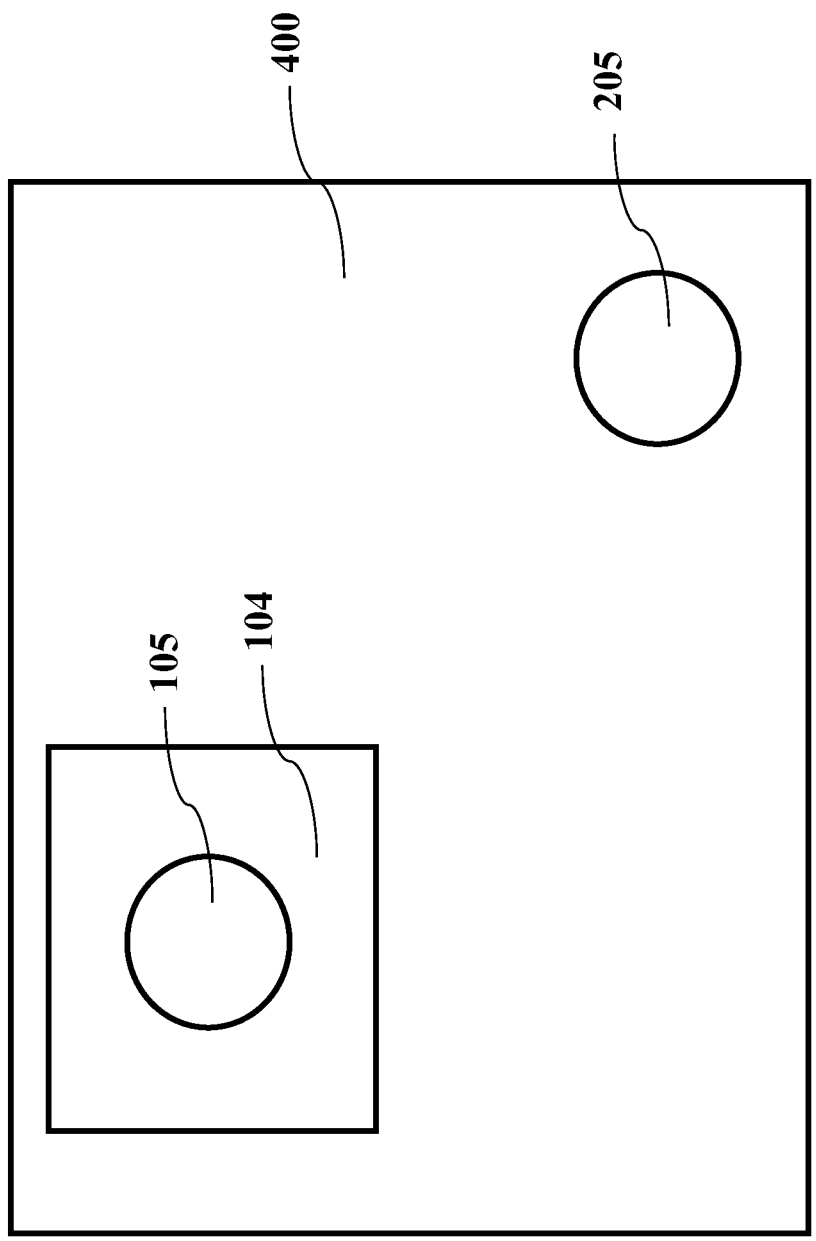

WARM WHITE LED WITH STACKED WAFERS AND FABRICATION METHOD THEREOF

CROSS-REFERENCE TO RELATED APPLICATIONS

The present application is a continuation of, and claims priority to, PCT/CN2013/082921 filed on Sep. 4, 2013, which claims priority to Chinese Patent Application No. 201210331791.7 filed on Sep. 10, 2012. The disclosures of these applications are hereby incorporated by reference in their entirety.

BACKGROUND

A Light emitting diode (LED) is a solid-state semiconductor device, which directly transfers electricity into light. As a promising "Green Lighting Source" in the future, the white LED has such advantages as high luminous efficiency, power saving, non-thermal radiation and is free of heavy metals such as mercury, pollution and waste. The white light is produced through (i) blue light LED's stimulation of yellow phosphor; (ii) UV-light LED's stimulation of RGB three-wavelength phosphor; or (iii) RGB three-primary-color LED's blending of light. The first two methods, which produce light via LED's stimulation of phosphor, have the disadvantage of low light conversion efficiency, impure and uneven color since it is difficult to control phosphor coating during packaging; and the third method requires complex circuit driving and has high production cost, which is not suitable for commercial application.

The existing warm white LED comprises a base, a blue light wafer and a gold thread. The blue light wafer is fixed inside the base and the gold thread is fixed and connected with the blue light wafer and the base. A phosphor layer, a mixture of yellow phosphor and red phosphor, is coated over the blue light wafer surface. The base peripheral is packaged with epoxy glue. The blue light wafer's blue light stimulates the yellow light and red light from the phosphor and mix them into low-color-temperature warm white LED. The general luminous efficiency of this warm white LED is reduced by 40%-50% compared with conventional yellow phosphor as the white light is mixed with red phosphor which has low conversion efficiency.

Another warm white LED is coated with a yellow phosphor layer mixing blue light wafer and red light wafer on the outside surface to produce warm white light. However, in packaging, the light emitted by the red light wafer or the blue light wafer is easily absorbed by the other. For this reason, a certain distance is designed between the blue light wafer and the red light wafer, further resulting in blending of light; in addition, large packaging structure increases production cost; and blue light wafer and the red light wafer are independent and the complex bonding may lead to abnormality and high cost.

SUMMARY

The present disclosure relates to a warm white LED and fabrication method thereof, wherein, the LED structure combines the red light wafer and the blue light wafer via a bonding layer; a reflecting layer is arranged over the upper and lower surfaces of the bonding layer respectively; the lower surface of the red light wafer takes up one-third or less of the upper surface of the blue light wafer, which effectively reduces packaging structure volume and time of bondings so as to optimize process flow and save fabrication cost.

According to a first aspect of the present disclosure, a warm white LED, comprising, a bonding layer, which has two main surfaces; a red light wafer mirror system over the first main surface of the bonding layer, comprising a red light wafer and a first reflecting layer; a blue light wafer mirror system over the second main surface of the bonding layer, comprising a blue light wafer and a second reflecting layer; and the first reflecting layer and the second reflecting layer are used to separate the red light wafer and the blue light wafer to avoid mutual absorption.

Preferably, the lower surface of the red light wafer takes up one-third or less of the upper surface of the blue light wafer.

According to a second aspect of the present disclosure, a fabrication method of warm white LED, comprising, combining the red light wafer mirror system with the blue light wafer mirror system via the bonding layer, wherein: the red light wafer mirror system comprises a red light wafer and a first reflecting layer; the blue light wafer mirror system comprises a blue light wafer and a second reflecting layer; the second reflecting layer is over the blue light wafer uncoated with yellow phosphor; the lower surface of the red light wafer takes up one-third or less of the upper surface of the blue light wafer; and the bonding layer adopts wafer bonding or electroplate bonding. According to a third aspect of the present disclosure, a lighting system is provided including a plurality of the warm-white-light LEDs. The lighting system may include other types of LEDs and components as well.

BRIEF DESCRIPTION OF THE DRAWINGS

FIG. 9 is a top view of the device shown in FIG. 8.

Figure 1:
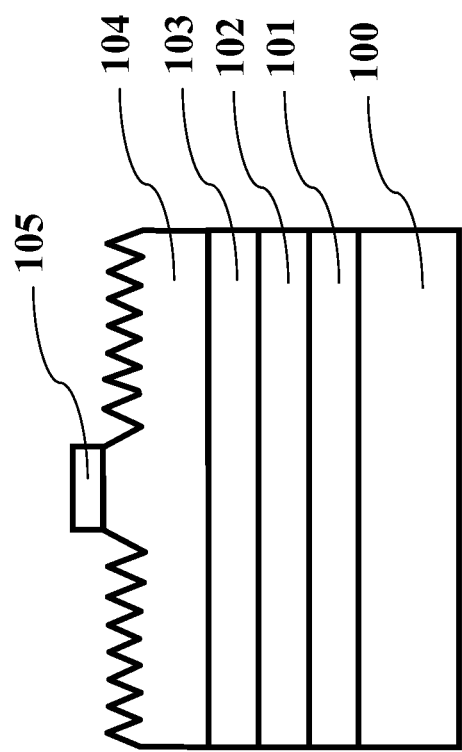
FIG. 1 is a sectional view illustrating a first step of fabricating a high-brightness LED according to some embodiments.

In the drawings: 100: growth substrate; 101, 201: n-type confinement layer; 102, 202: light-emitting layer; 103, 203: p-type confinement layer; 104: P-GaP window layer; 105: P electrode; 106: temporary substrate; 107: dielectric layer; 108: metal reflecting layer; 200: permanent substrate; 204: second reflecting layer; 205: N electrode; 300: bonding layer; 400: yellow phosphor.

DETAILED DESCRIPTION

The following embodiments disclose a warm white LED and fabrication method. The LED structure combines the red light wafer and the blue light wafer coated with yellow phosphor via a bonding layer. A reflecting layer is arranged over the upper and lower surfaces of the bonding layer respectively. The lower surface of the red light wafer takes up one-third or less of the upper surface of the blue light wafer, which effectively reduces packaging structure volume and time of bondings so as to optimize process flow and save fabrication cost.

A warm white LED, comprising a bonding layer, which has two main surfaces; a red light wafer mirror system over the first main surface of the bonding layer, comprising a red light wafer and a first reflecting layer; a blue light wafer mirror system coated with yellow phosphor over the second main surface of the bonding layer, comprising a blue light wafer and a second reflecting layer; and a second reflecting layer over the blue light wafer surface uncoated with yellow phosphor.

The red light wafer comprises a light-emitting epitaxial layer and can comprise a transparent conducting layer. The growth substrate of the red light wafer can be GaAs and the temporary substrate of the red light wafer can be Si, GaP, SiC, Cu, Ni, Mo, AlN, etc. The light-emitting epitaxial layer of the red light wafer is AlGaInP quaternary semiconductor compound, comprising an n-type confinement layer, a light-emitting layer and a p-type confinement layer, and the light-emitting layer can be a multiple-quantum well structure. The first reflecting layer can be a metal reflecting layer or a dielectric layer, or a combination of the two.

The blue light wafer comprises a growth substrate, a light-emitting epitaxial layer, and can comprise a transparent conducting layer. The permanent substrate of the blue light wafer can be Si, GaN, SiC, $Al_2O_3$, etc. The light-emitting epitaxial layer of the blue light wafer is GaN or InGaN semiconductor compound, comprising an n-type confinement layer, a light-emitting layer and a p-type confinement layer, and the light-emitting layer can be a multiple-quantum well structure. The second reflecting layer can be a metal reflecting layer or a dielectric layer, or a combination of the two. The metal reflecting layer can be made of at least one of Al, Ag, Ni and Zn.

The combination of red light wafer and blue light wafer via the bonding layer structure, together with the coating of yellow phosphor, can produce extremely small warm white light source to eliminate time of bondings and save fabrication cost; design of the first reflecting layer and the second reflecting layer can effectively separate the red light wafer and the blue light wafer to avoid mutual absorption and to effectively reduce the size of packaging body.

Detailed description will be provided below with reference to various embodiments and drawings.

EMBODIMENTS

Figure 8:
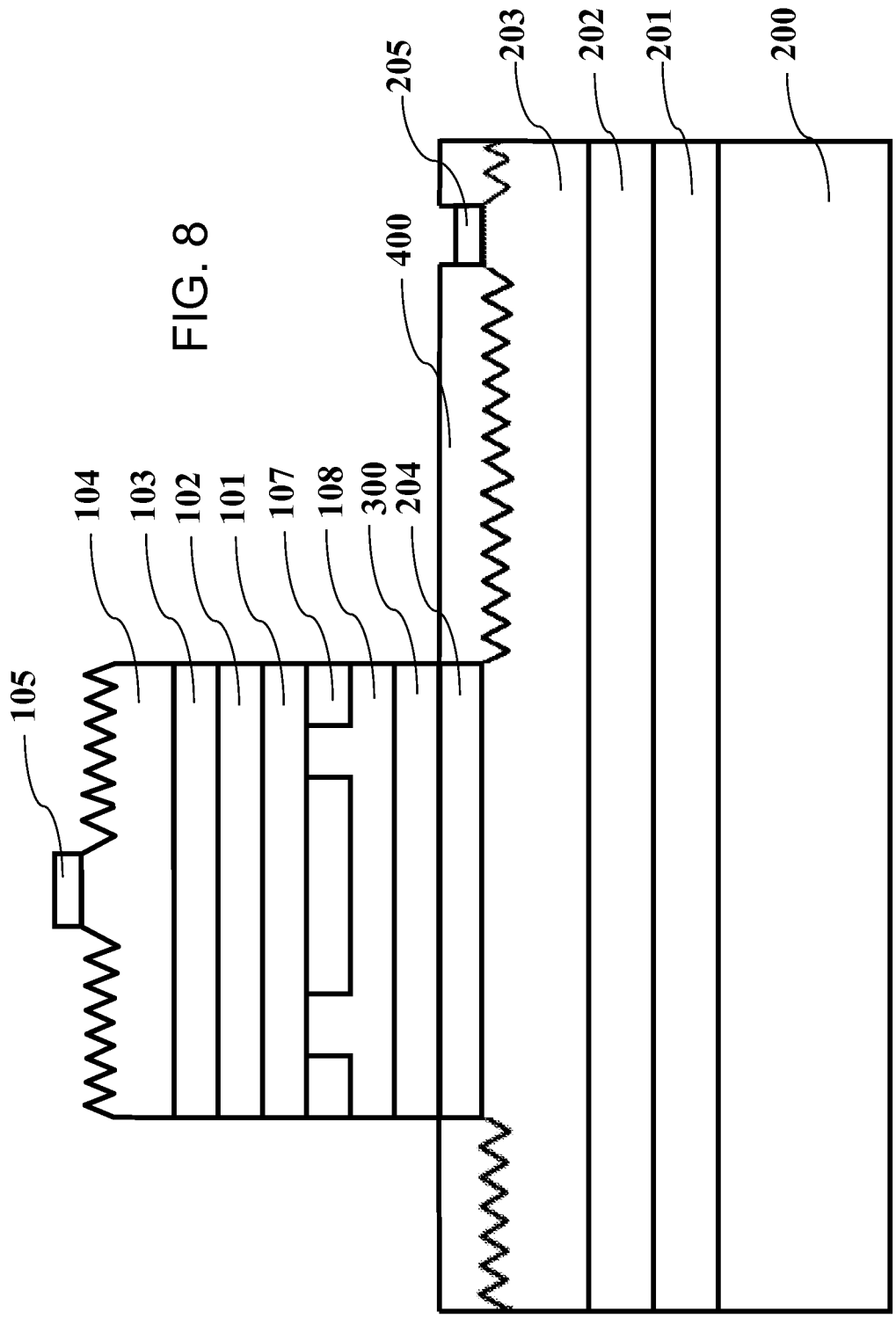
FIG. 8 is a sectional view illustrating an eighth step of fabricating a high-brightness LED according to some embodiments.

As shown in FIG. 8 and FIG. 9, the warm white LED comprises a bonding layer 300, which has two main surfaces; a red light wafer mirror system over the first main surface of the bonding layer 300; a blue light wafer mirror system coated with yellow YAG phosphor 400 over the second main surface of the bonding layer 300; and the lower surface of the red light wafer takes up one-third of the upper surface of the blue light wafer.

The red light wafer mirror system comprises a red light wafer and a first reflecting layer. The first reflecting layer comprises a latticed $SiO_2$ dielectric layer 107 and an Ag metal reflecting layer 108; the red light wafer, from bottom to up, comprises an n-AlGaInP layer 101, a light-emitting layer 102, a p-AlGaInP layer 103, a roughened GaP window layer 104 and an N electrode 105.

The blue light wafer mirror system comprises a blue light wafer and a second reflecting layer 204. The second reflecting layer 204 comprises an Ag metal reflecting layer over the blue light wafer surface uncoated with yellow YAG phosphor 400; the blue light wafer, from bottom to up, comprises a permanent sapphire substrate 200, an n-GaN layer 201, a light-emitting layer 202, a p-GaN layer 203 and a P electrode 205.

The fabrication process of the warm white LED may comprises:

As shown in FIG. 1, first, growing, from bottom to up, the n-AlGaInP layer 101, the light-emitting layer 102, the P—AlGaInP layer 103 and the GaP window layer 104 over the GaAs growth substrate 100 via epitaxial growth; fabricating the P electrode 105 and forming the GaP window layer 104 into a roughening structure via dry etching.

Figure 2:
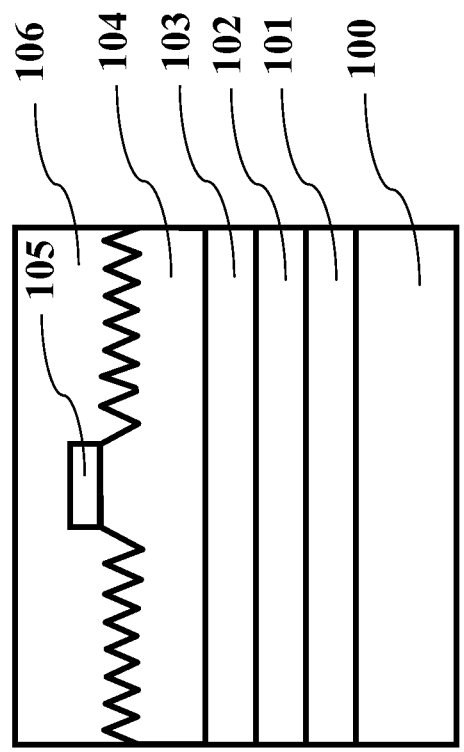
FIG. 2 is a sectional view illustrating a second step of fabricating a high-brightness LED according to some embodiments.

As shown in FIG. 2, transferring the roughened structure to the Si temporary substrate 106 via bonding.

Figure 3:
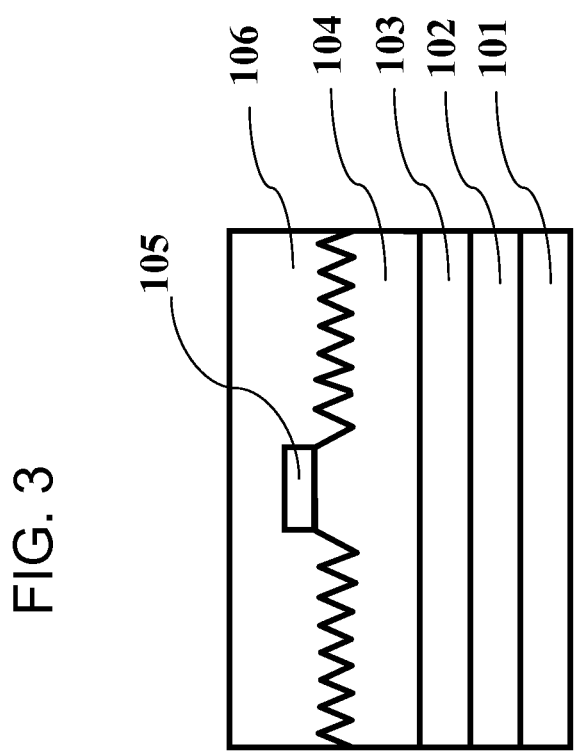
FIG. 3 is a sectional view illustrating a third step of fabricating a high-brightness LED according to some embodiments.

As shown in FIG. 3, removing the GaAs growth substrate 100 and exposing the n-AlGaInP layer 101 surface to form a red light wafer.

Figure 4:
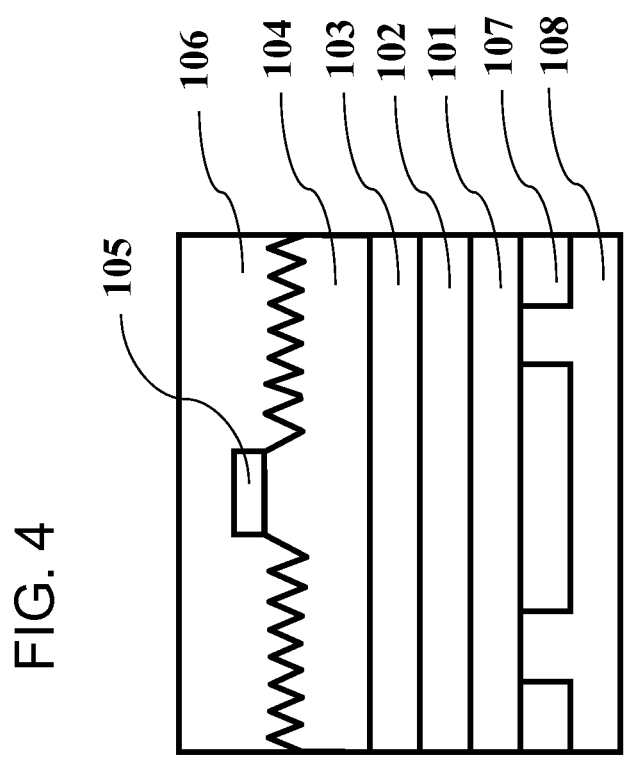
FIG. 4 is a sectional view illustrating a fourth step of fabricating a high-brightness LED according to some embodiments.

As shown in FIG. 4, forming a first reflecting layer structure over the exposed n-AlGaInP layer 101; the first reflecting layer comprises a latticed $SiO_2$ dielectric layer 107 and an Ag metal reflecting layer 108.

Figure 5:
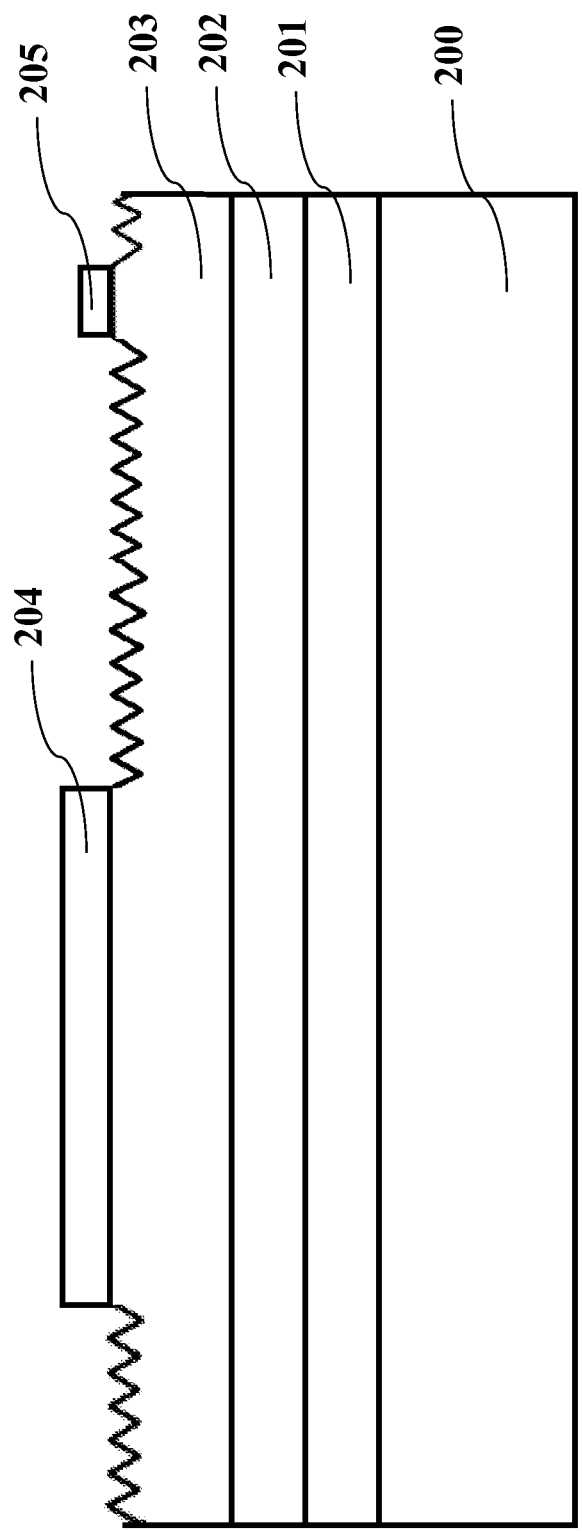
FIG. 5 is a sectional view illustrating a fifth step of fabricating a high-brightness LED according to some embodiments.

As shown in FIG. 5, growing, from bottom to up, the n-GaN layer 201, the light-emitting layer 202 and the p-GaN layer 203 over the permanent sapphire substrate 200 via epitaxial growth; fabricating the second reflecting layer (Ag metal reflecting layer) 204 and the N electrode 205; and forming the p-GaN layer 203 into a roughening structure via wet etching.

Figure 6:
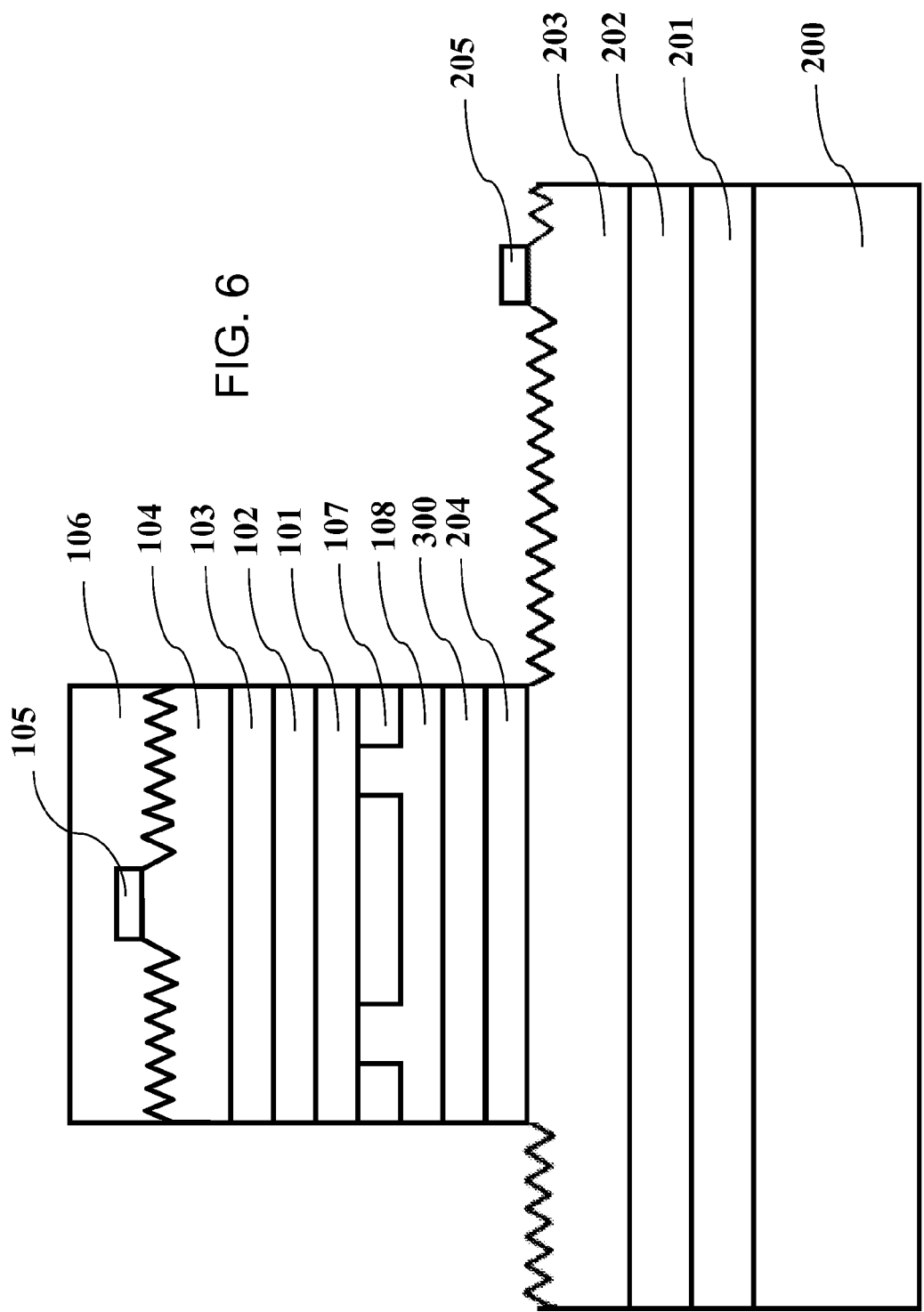
FIG. 6 is a sectional view illustrating a sixth step of fabricating a high-brightness LED according to some embodiments.

As shown in FIG. 6, bonding the red light wafer and the blue light wafer via wafer bonding technology through the bonding layer 300; a first reflecting layer (comprising the latticed $SiO_2$ dielectric layer 107 and the Ag metal reflecting layer 108) is arranged over the upper surface of the bonding layer 300, and a second reflecting layer 204 is arranged over the lower surface.

Figure 7:
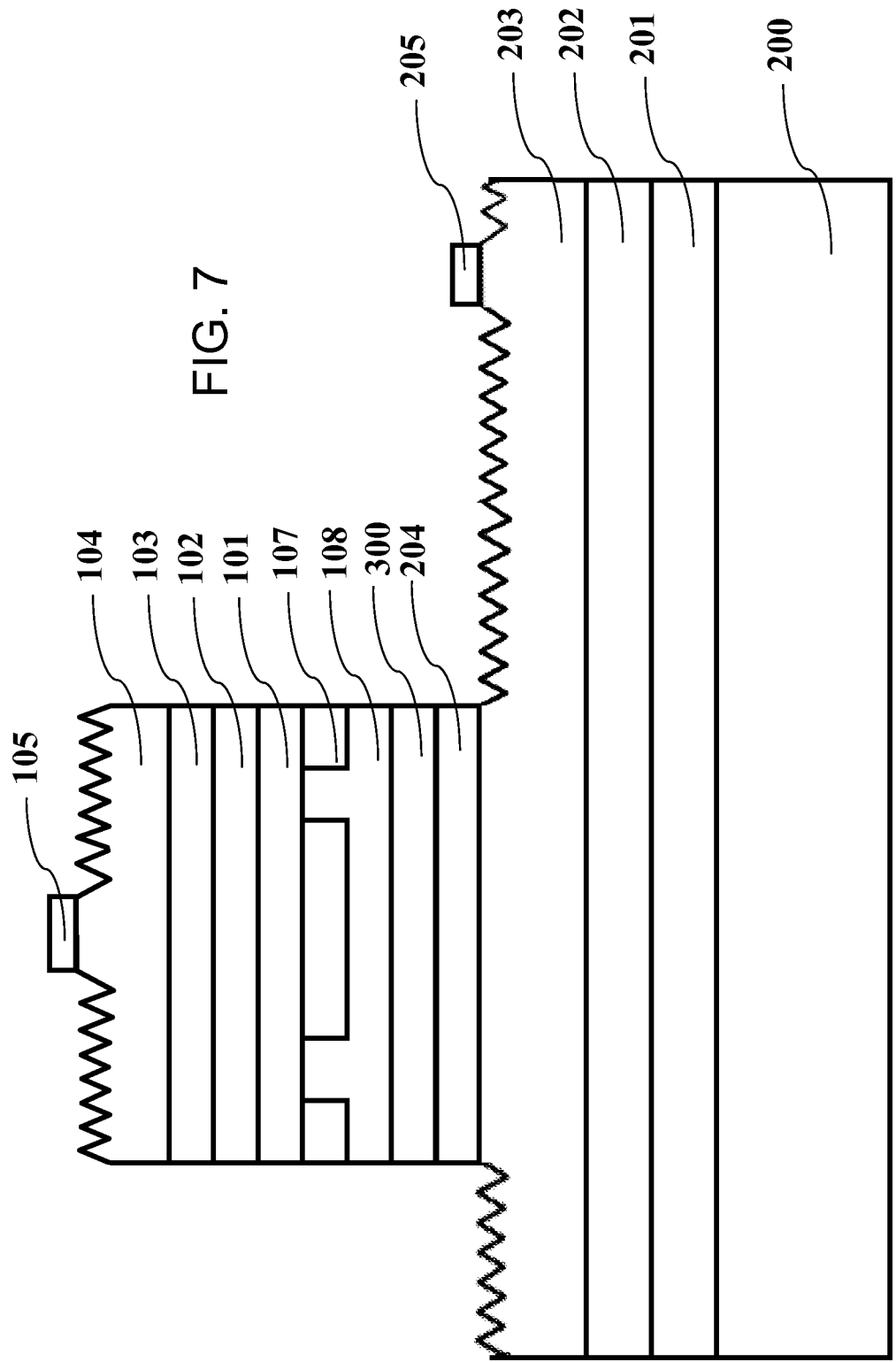
FIG. 7 is a sectional view illustrating a seventh step of fabricating a high-brightness LED according to some embodiments.

As shown in FIG. 7, removing the Si temporary substrate 106.

As shown in FIGS. 8 and 9, coating the yellow YAG phosphor 400 over the p-GaN layer of the roughened blue light wafer to complete fabrication of the warm white LED.

A lighting system may be provided including a plurality of the warm-white-light LEDs described above, as well as other types of LEDs and components.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A warm-white-light LED comprising:
a bonding layer having a first and a second main surfaces;
a red light wafer mirror system over the first main surface of the bonding layer, including a red light wafer and a first reflecting layer; and
a blue light wafer mirror system over the second main surface of the bonding layer, including a blue light wafer and a second reflecting layer;
wherein the first reflecting layer and the second reflecting layer are configured to separate the red light wafer and the blue light wafer to avoid mutual absorption; and
wherein the red light wafer has a lower surface area less than or equal to one third of an upper surface area of the blue light wafer.

2. The LED of claim 1, wherein the first reflecting layer is a metal reflecting layer or a dielectric layer, or a combination thereof.

3. The LED of claim 1, wherein the second reflecting layer is a metal reflecting layer or a dielectric layer, or a combination thereof.

4. A warm-white-light LED comprising:
a bonding layer having a first and a second main surfaces;
a red light wafer mirror system over the first main surface of the bonding layer, including a red light wafer and a first reflecting layer; and
a blue light wafer mirror system over the second main surface of the bonding layer, including a blue light wafer and a second reflecting layer;
wherein the first reflecting layer and the second reflecting layer are configured to separate the red light wafer and the blue light wafer to avoid mutual absorption; and
wherein the upper surface of the blue light wafer is coated with a layer of yellow phosphor; and the second reflecting layer is disposed over a portion of a surface of the blue light wafer uncoated with the yellow phosphor.

5. A method of fabricating a warm-white-light LED, the method comprising:
combining a red light wafer mirror system with a blue light wafer mirror system via a bonding layer,
wherein the red light wafer mirror system comprises a red light wafer and a first reflecting layer; the blue light wafer mirror system comprises a blue light wafer and a second reflecting layer; and the first reflecting layer and the second reflecting layer are configured to separate the red light wafer and the blue light wafer to avoid mutual absorption; and
wherein a lower surface of the red light wafer takes up one third or less of an upper surface of the blue light wafer.

6. The method of claim 5, wherein said bonding comprises at least one of wafer bonding or electroplate bonding.

7. The method of claim 5, further comprising:
growing, from bottom up, an n-type confinement layer, a light-emitting layer, and a p-type confinement layer via epitaxial growth over a growth substrate;
fabricating a P electrode and forming the p-type confinement layer into a roughening structure;
transferring the roughened structure to a temporary substrate;
removing the growth substrate and exposing a surface of the n-type confinement layer to form a red light wafer;
forming a first reflecting layer structure over the exposed n-type confinement layer;
growing, from bottom to up, the n-type confinement layer, the light-emitting layer and the p-type confinement layer via epitaxial growth over a permanent substrate;
fabricating a second reflecting layer and an N electrode;
forming the p-type confinement layer into a roughening structure;
bonding the red light wafer and the blue light wafer through the bonding layer; wherein a first reflecting layer is arranged over an upper surface of the bonding layer, and a second reflecting layer is arranged over the lower surface; and
removing the temporary substrate.

8. The method of claim 5, further comprising:
growing, from bottom up, an n-type confinement layer, a light-emitting layer, a p-type confinement layer and a transparent conducting layer via epitaxial growth over a growth substrate;
fabricating the P electrode and forming the transparent conducting layer into a roughening structure;
transferring the roughened structure to a temporary substrate;
removing the growth substrate and exposing the n-type confinement layer to form a red light wafer;
forming a first reflecting layer structure over the exposed n-type confinement layer;
growing, from bottom to up, the n-type confinement layer, the light-emitting layer and the p-type confinement layer via epitaxial growth over a permanent substrate;
fabricating a second reflecting layer and an N electrode;
forming the p-type confinement layer into a roughening structure;
bonding the red light wafer and the blue light wafer through the bonding layer; wherein a first reflecting layer is arranged over an upper surface of the bonding layer, and a second reflecting layer is arranged over a lower surface; and
removing the temporary substrate.

9. A lighting system comprising a plurality of warm-white-light LEDs, each LED comprising:
a bonding layer having a first and a second main surfaces;
a red light wafer mirror system over the first main surface of the bonding layer, including a red light wafer and a first reflecting layer; and
a blue light wafer mirror system over the second main surface of the bonding layer, including a blue light wafer and a second reflecting layer;
wherein the first reflecting layer and the second reflecting layer are configured to separate the red light wafer and the blue light wafer to avoid mutual absorption; and
wherein the red light wafer has a lower surface area less than or equal to one third of an upper surface area of the blue light wafer.

10. The system of claim 9, wherein the first reflecting layer is a metal reflecting layer or a dielectric layer, or a combination thereof.

11. The system of claim 9, wherein the second reflecting layer is a metal reflecting layer or a dielectric layer, or a combination thereof.

12. A lighting system comprising a plurality of warm-white-light LEDs, each LED comprising:
a bonding layer having a first and a second main surfaces;
a red light wafer mirror system over the first main surface of the bonding layer, including a red light wafer and a first reflecting layer; and
a blue light wafer mirror system over the second main surface of the bonding layer, including a blue light wafer and a second reflecting layer;
wherein the first reflecting layer and the second reflecting layer are configured to separate the red light wafer and the blue light wafer to avoid mutual absorption; and wherein the upper surface of the blue light wafer is coated with a layer of yellow phosphor; and the second reflecting layer is disposed over a portion of a surface of the blue light wafer uncoated with the yellow phosphor.

* * * * *